United States Patent [19]
Park

[11] Patent Number: 5,838,271
[45] Date of Patent: Nov. 17, 1998

[54] DIGITAL TO ANALOG CONVERTER AND BIAS CIRCUIT THEREFOR FOR PROVIDING WEIGHED CURRENTS

[75] Inventor: Yong In Park, Seoul, Rep. of Korea

[73] Assignee: LG Semicon Co., Ltd., Cheongju, Rep. of Korea

[21] Appl. No.: 791,574

[22] Filed: Jan. 31, 1997

[51] Int. Cl.⁶ .................................................. H03M 1/66
[52] U.S. Cl. ........................... 341/144; 341/145; 341/118
[58] Field of Search .................................. 341/144, 145, 341/118

[56] References Cited

U.S. PATENT DOCUMENTS

| | | | |
|---|---|---|---|
| 4,904,922 | 2/1990 | Colles | 341/136 |
| 5,017,919 | 5/1991 | Hull et al. | 341/136 |
| 5,070,331 | 12/1991 | Hisano | 341/154 |
| 5,164,725 | 11/1992 | Long | 341/118 |
| 5,254,994 | 10/1993 | Takakura et al. | 341/153 |
| 5,283,580 | 2/1994 | Brooks et al. | 341/145 |
| 5,293,166 | 3/1994 | Ta | 341/118 |
| 5,406,285 | 4/1995 | Diffenderfer | 341/144 |
| 5,483,150 | 1/1996 | Elliott et al. | 323/312 |
| 5,539,405 | 7/1996 | Norsworthy | 341/153 |
| 5,568,145 | 10/1996 | Reynolds | 341/145 |
| 5,623,264 | 4/1997 | Park | 341/144 |
| 5,646,619 | 7/1997 | Daubert et al. | 341/118 |

*Primary Examiner*—Jeffrey A. Gaffin
*Assistant Examiner*—Kim N. Huynh
*Attorney, Agent, or Firm*—Fleshner & Kim

[57] ABSTRACT

A b-bit digital and analog converter of the present invention is relatively simple and non-expensive and monotonic with relatively high differential and integral non-linearities. The converter uses weighed current ratio to achieve decrease the number of current cells to provide a cumulative current which corresponds to the digital value on the input data bus. The converter includes preferably a plurality of upper current cells, at least one unit current cell and at least one lower current cell. The currents produced by the upper, lower and unit current cells have a predetermined weighed current ratio, and the number of the upper, unit and lower current cells are based on the weighed current ratio. Further, the plurality of upper current cells have a prescribed layout, and includes a group of cells where each current cell has reverse layout orientation compared to adjacent cells.

56 Claims, 12 Drawing Sheets

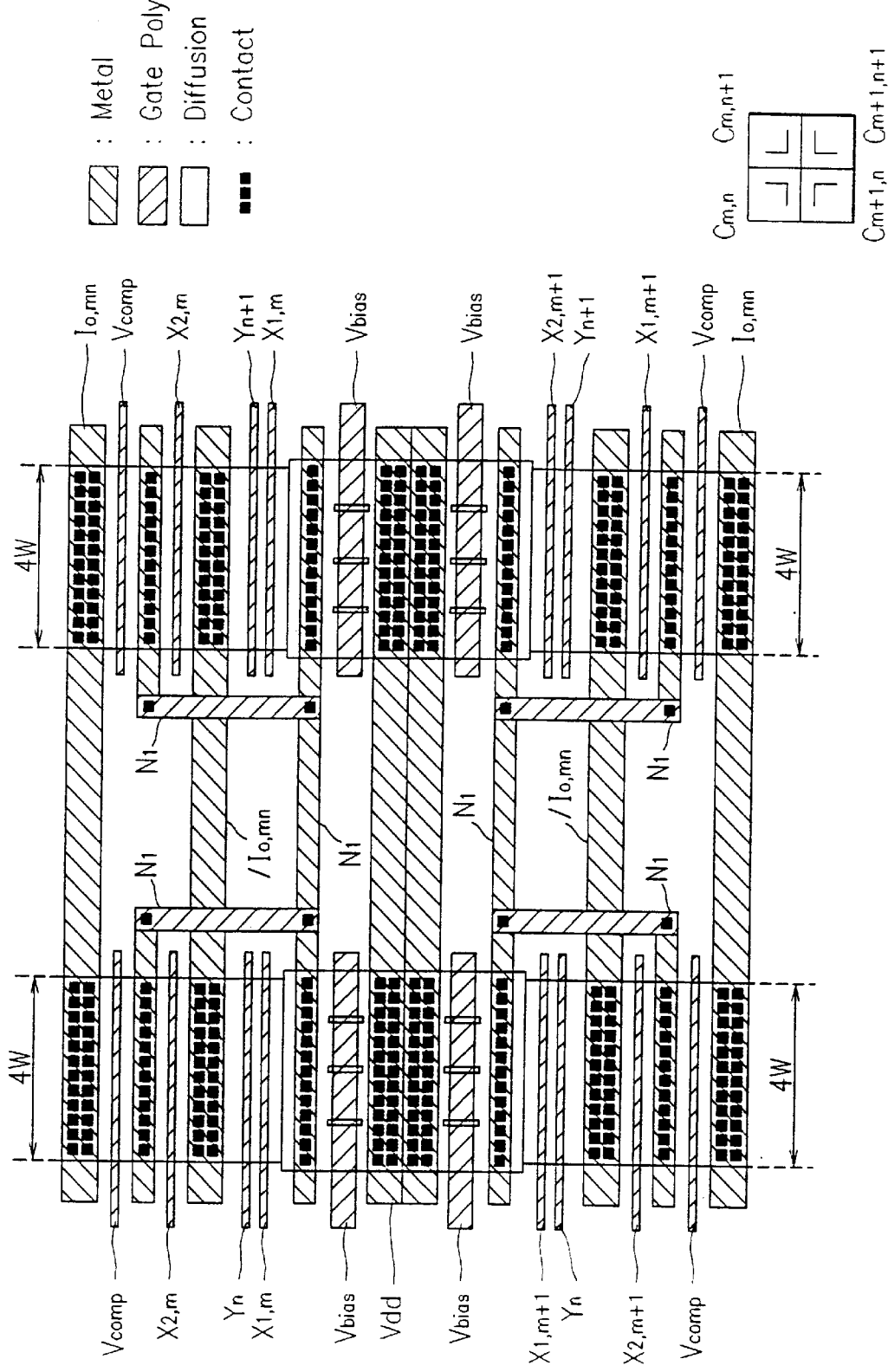

DIGITAL TO ANALOG CONVERTER AND BIAS CIRCUIT THEREFOR FOR PROVIDING WEIGHED CURRENTS

BACKGROUND OF THE INVENTION

1. Field of the Invention

The present invention relates to an apparatus for converting a digital signal to an analog signal, and more particularly, a digital to analog converter and a bias circuit therefor.

2. Background of the Related Art

Digital-to-analog (D/A) converters are used to convert digital data to an analog equivalent. Such D/A converters are used in various types of equipment, including digital computers, data processing systems, process control equipment, measuring instruments, communication equipment and a wide variety of other equipment. For example, a D/A converter for a video board of a personal computer (PC) will convert digital video data generated by the PC into analog signals which can drive a video display. Since modern color video displays can display hundreds or even thousands of hues and intensities, it is important that the D/A conversion be very accurate to avoid errors in the displayed image.

As digital computers and data processing equipments have become widespread throughout industry and have even become common in the home, there is a need for an inexpensive, simple and reliable apparatus for converting information between digital and analog forms. A considerable effort has been devoted over a period of time to provide a D/A converter which is simple, inexpensive and reliable.

U.S. Pat. Nos. 4,904,922 to Colles, U.S. Pat. No. 5,070,331 to Hisano, U.S. Pat. No. 5,293,166 to Ta and U.S. Pat. No. 5,406,285 to Diffenderfer illustrate various types of a D/A converter. As shown in FIG. 1, a prior art D/A converter 1 generally includes a decoder 2, an array 4 of current cells 6, and a bias generator 8. The current cells 6 of the array 4 are connected in parallel, and each of the cell includes a current source 5. The digital data from a data bus 9 is applied to the decoder 2, which selectively activates one or more current cells 6 to produce a cumulative current, corresponding the digital data on the data bus 9, on an analog output line 7. The bias generator 8 produces a bias voltage on bias line 3 which controls the current source of each current cell 6.

There is a need for a D/A converter to be monotonic with a relatively high differential and integral non-linearities. "Monotonic" means that digital information of progressively increasing value is converted to analog information of progressively increasing value without any decrease in the analog value as the digital value progressively increases. Integral non-linearities result from errors produced in a conversion between analog and digital values over a wide range of such values. Differential non-linearities result from errors produced in a conversion between analog and digital values over a relatively narrow range of such values. To achieve such a D/A converter, the related art D/A converters may be quite expensive and complex.

For example, the number n of cells 6 in the array 4 is related to the number of bits b on data bus 9 by the relationship $n=2^b$. If the data bus 9 is 4 bits wide to represent a digital value from 0–15, there will be $n=2^4=16$ current cells to produce a analog current value corresponding to any of the digital values. If the data bus has a digital binary value of "0100", corresponding to a decimal value of "4", four of the cells 16 in the array is activated to generate a cumulative current corresponding to the digital binary value, i.e., the number of current cells activated at any one time corresponds to the numeric value of the datum on the data bus 9. The cumulative current corresponds to the analog value.

As described above, modern color video displays can display hundreds or even thousands of hues-and intensities. In order to generate numerous hues and intensities for a color video displays, which presently uses analog signals, the number of cells 6 in the array needs to increase with the increase in digital values. For example, in order to generate analog values corresponding to 512 digital values, i.e., 0–511, the data bus 9 increases to 9 bits. To be monotonic, the number of cells 6 in the array increases to $n=2^9=512$ cells.

Such increase in cells result in increase of the device count and real-estate usage of the D/A converter. Further, more pheriperal devices are needed to accomodate the increase in the number of cells. Moreover, such large number of cells tend to slow the operational speed of the the D/A converter, which is unacceptable for devices which may operate at high frequencies of, e.g., 100 MHz or more.

Further, the bias generator 8 is sensitive to a voltage variation ΔV of the source voltage Vdd, and is also sensitive to noise present in the substrate. Such voltage variation and noise deteriorate the PSRR (Power Supply Rejection Ratio), resulting in high linearity error to affect the accuracy of the D/A converter. The accuracy of the D/A converter is further aggravated with the increase in the device count of the current cells. As shown, the bias generator 8 provides a reference voltage Vref to the current cells. Due the the voltage variation ΔV of the source voltage Vdd, a constant reference voltage Vref is not generated by the bias generator 8, resulting in an error current $I_e$ to be generated by each current cell 6. Since the outputs of all of the current cells 6 are coupled together in parallel, this will result in a cumulative error current $I_E=e2^b$, which can be substantial as the number of current cells increases with the increase in the number of bits on the data bus 9 for increasing the digital values.

There is difficulty in providing a D/A converter which provides a monotonic output, with minimal integral and differential errors, even while operating at relatively high frequencies. Further, there is a difficulty to provide a D/A converter with relatively low device count and real-estate usage. Moreover, it is difficult to provide an accurate D/A converter which is non-expensive and non-complex.

The above references are incorporated by reference herein where appropriate for appropriate teachings of additional or alternative details, features and/or technical background.

SUMMARY OF THE INVENTION

It is an object of the present invention to solve the problems of the related art.

An object of the present invention is to provide an accurate D/A converter.

Another object of the invention is to provide a high speed D/A converter.

A further object of the invention is to provide a D/A converter which is relatively inexpensive and non-complex.

Still another object of the invention is to provide a D/A converter with low device count and low real-estate usage.

Still another object of the invention is to a high resolution D/A converter.

A further object of the invention to provide a D/A converter with a high S/N (Signal to Noise) ratio.

Another object of the invention is to improve the mismatch.

Another object of the invention is to improve the PSRR against the power supply noise.

An object of the present invention is to reduce the linearity error of a D/A converter.

It is an object of the present invention to provide a D/A converter with substantially no glitches during operation.

Such advantages, objects and features may be realized in whole or in part by a circuit for converting a digital signal of b-bits to an analog signal, where b is a positive integer, comprising: a first array of first current cells; a second array having at least one second current cell; a selection circuit coupled to the first and second arrays such that a first predetermined number of first current cells and a second predetermined number of second current cells are activated in accordance with the digital signal; and means for generating at least one of voltages and clock signals coupled to at least one of the first and second arrays and the selection circuit, wherein each selected first current cell generates a predetermined first current and each selected second current cell generates a predetermined second current to an output line, the predetermined first current having a magnitude different from the second predetermined current.

The present invention can be achieved in part or in whole by a cell array for a b-bit digital to analog converter, comprising: a plurality of first current cells; and at least one second current cell, wherein each of the first current cell generates a predetermined first current and each second current cell generates a predetermined second current, the predetermined first current having a magnitude different from the second predetermined current.

The present invention can be achieved also in part or in whole by a current cell for a digital to analog converter, comprising: a current source coupled between a first potential and a node; and a switching circuit coupled to the node and including: a) serially connected transistors coupled between the node and a second potential; b) a first transistor coupled in parallel with the serially connected transistors; and c) a second transistor coupled between the node and an ouput line of the converter.

The invention can be achieved also in part or in whole by a bias circuit for a digital to analog converter, comprising: a first resistor coupled between a first potential and a first node; a first transistor coupled between the first node and a second potential; a pair of first and second bias transistors coupled between the first and second potential; a current source coupled to the first and second bias transistors and coupled between the first and second potentials; and an operational amplifier having a first input coupled to the first node and the second bias transistor, a second input coupled to the second bias transistor and the current source, and an output coupled to the first bias transistor and the current source.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 8B illustrates the layout of four adjacent upper current cells of FIG. 8A.

DETAILED DESCRIPTION OF PREFERRED EMBODIMENTS

Figure 1:
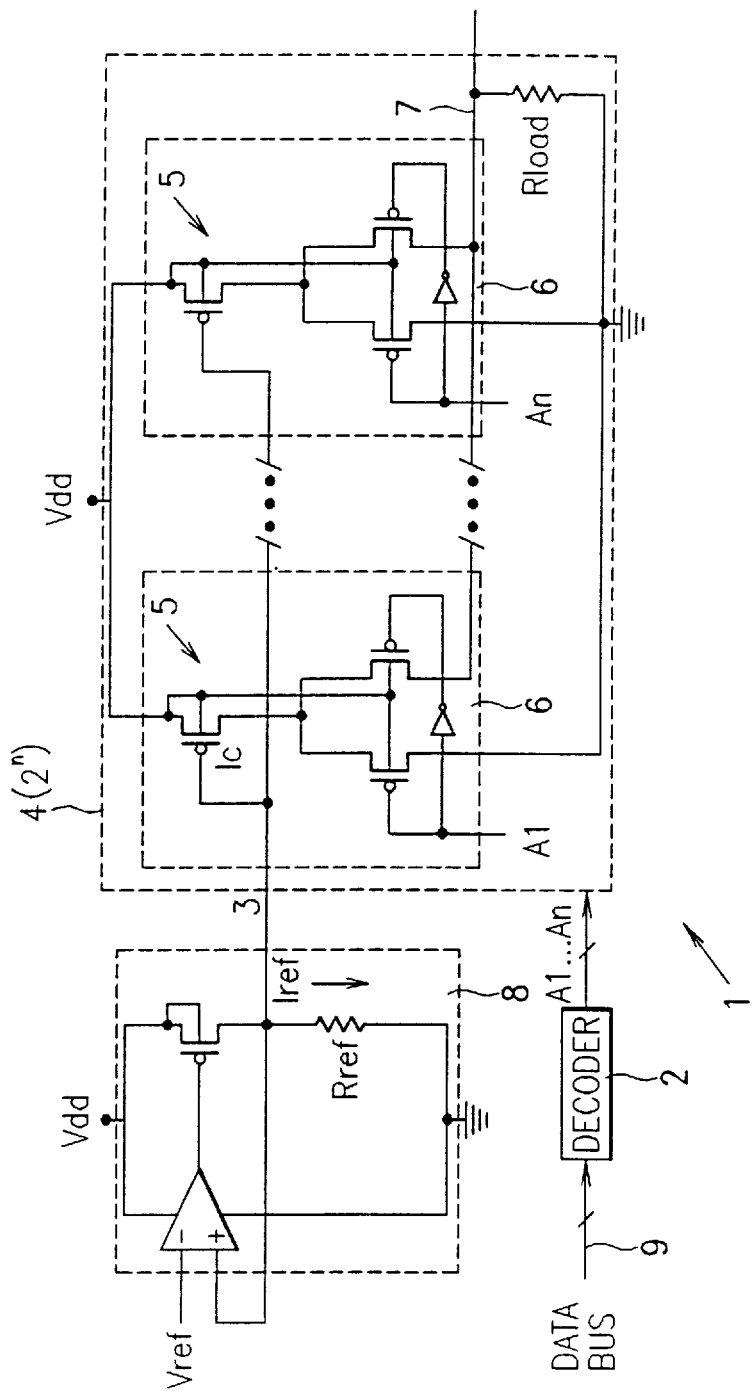
FIG. 1 illustrates a D/A converter of the related art.
Figure 2:
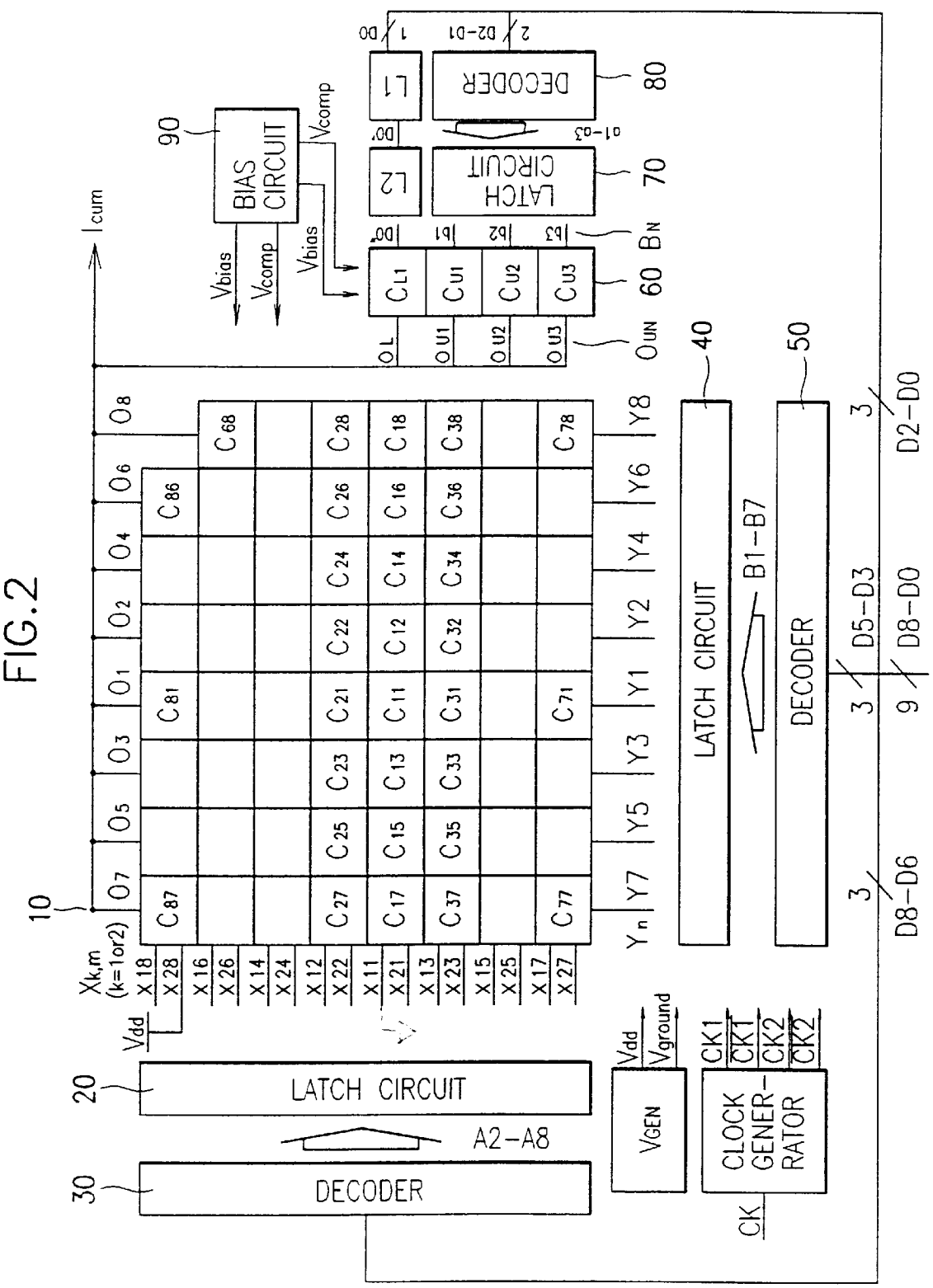
FIG. 2 illustrates a D/A converter in accordance with a preferred embodiment of the present invention.

FIG. 2 illustrates a 9-bit D/A converter in accordance with a preferred embodiment of the present invention which is capable of generating a cumulative current Icum corresponding to any digital binary values from "000000000" to "111111111", i.e., 512 different decimal values, on the data bus. The D/A converter includes a first array 10 of first currents cells $C_{m,n}$ ($C_{1,1}$ to $C_{8,7}$) receiving row inputs signals on row lines $X_{k,m}$ (k=1–2 and m=1–8) from a first latch circuit 20 connected to a first thermometer decoder 30 providing a plurality of first decoded signals via lines $A_8$–$A_2$, and receiving column input signals on column lines $Y_n$ (n=1–8) from a second latch circuit 40 connected to a second thermometer decoder 50 providing a plurality of second decoded signals via lines $B_7$–$B_1$.

The D/A converter also includes a second array 60 of second current cells $C_{U1}$–$C_{U3}$ and $C_{L1}$ receiving latched signals on lines $b_1$–$b_3$ and $D_0$" from a third latch circuit 70 and a second latch L2 connected to a third thermometer decoder 80 and a first latch L1, respectively. When a nine bit data D8–D0 is inputted, data bits D8–D6 are provided to the first thermometer decoder 30 and data bits D5–D3 are provided to the second thermometer decoder 50, whereas data bits D2–D1 are provided to the third thermometer decoder 80 and data bit D0 is provided to the first latch L1.

The first thermometer decoder 30 decodes the data bits D8–D6 to generate the first plurality of decoded signals on the lines $A_8$–$A_2$. Each of the first decoded signals on the lines $A_8$–$A_2$ is inputted to the first latch circuit 20, and the first latch circuit 20 outputs row input signals on the input lines $X_{k,m}$. As shown, except for the input lines $X_{1,1}$ and $X_{2,8}$, which are connected to a ground potential Vgnd and source potential Vdd, respectively, the input signal on the input line $X_{k,m}$ is also the input signal on the input line $X_{2,m-1}$ (where 1<m≦8). Each of the first current cell in a row receives a corresponding input signal on the input line $X_{1,m}$.

The second thermometer decoder 50 decodes the data bits D5–D3 to generate a second plurality of decoded signals on the lines $B_7$–$B_1$. Each of the decoded signals on lines $B_7$–$B_1$ is inputted to the second latch circuit 40, which outputs column input signals on the column input lines $Y_n$. The input line $Y_8$ is connected to the source potential Vdd. Each of the first current cells in a column receives the corresponding input signal $Y_n$.

The third thermometer decoder 80 decodes the data bits D2–D1 to generate a third plurality of decoded signals on lines $a_3$–$a_1$, which is provided to the the third latch circuit 70. The latched signals are inputted to the second current cells $C_{U1}$–$C_{U3}$ via lines $b_1$–$b_3$, respectively. The least significant bit (LSB) D0 is provided to the first and second latches L1 and L2, and the latched signal is provided to the second current cell $C_{L1}$ via line $D_0''$.

The first, second and third latch circuits 20, 40 and 70, first, second and third decoders 30, 50 and 80 and first and second latches L1 and L2 comprises the selection circuit. Although FIG. 2 illustrates those components separately, the selection circuit can be integrated into a single component or grouped components, as can be appreciated by one of ordinary skill in the art. Likewise, the upper, lower and unit current cells may be integrated.

A bias circuit 90 provides a bias voltage $V_{bias}$ and a comparison voltage $V_{comp}$ to each cell in the first and second arrays 10 and 60. A clock generator generates four clock signals CK1, /CK1, CK2 and /CK2 in response to a clock signal CK, where CK1 and CK2 are 180 degrees out of phase with /CK1 and /CK2, respectively, for synchronizing the circuits of the D/A converter. A voltage generator $V_{GEN}$ provides a source potential Vdd and a ground potential Vgnd for the various circuits of the D/A converter. Unlike the prior art, which would require 512 current cells, the D/A converter of the present invention uses weighed currents to generate a cumulative current Icum corresponding to the 512 possible digital value of bits D8–D0 on the data bus. Due to the weighed currents, the first current cells $C_{m,n}$ of the first array 10 comprise 63 upper current cells $C_{1,1}$–$C_{8,7}$, and the second current cells of the second array 60 comprises three unit current cells $C_{U1}$–$C_{U3}$ and one lower current cell $C_{L1}$. When activated, the lower current cell $C_{L1}$ generates a predetermined lower current $I_L$ on an output line $O_L$, and each of the activated unit current cells $C_{U1}$–$C_{U3}$ generates an unit current $I_{UN}$ of $2*I_L$ on an output line $O_{UN}$ (N=1 to 3) whereas each of the activated upper current cells $C_{m,n}$ generates an upper current $I_{o,mn}$ of $8*I_L$ on a column output line $O_n$. All the outputs of each upper current cell in the column are connected to a corresponding column output line $O_n$, and the output lines $O_L$ and $O_{UN}$ are connected together. The currents $I_L$, $I_{UN}$ and $I_{o,mn}$ on all the output lines $O_1$–$O_8$, $O_{U1}$–$O_{U3}$ and $O_L$ are summed to provide the cumulative current Icum corresponding to the digital value on the 9-bit data bus.

The following general equation sets forth the rule for the number of activated upper current cells $C_{m,n}$, unit current cells $C_{UN}$ and lower cells $C_L$ required for the cumulative current Icum to correspond with the digital values on the b-bit data bus.

$$Icum = A*(8*I_L) + B*(2*I_L) + C*(1*I_L),$$

where A equals the number of activated upper current cells, B equals the number of activated unit current cells and C equals the number of activated lower cells.

In this embodiment, the number of bits b on the data bus is 9, and Icum must have a total of 512 or($2^9$) different values. To achieve a linear variations of the cumulative current Icum, A=0–63, B=0–3 and C=0–1. The cumulative current Icum can vary from zero to $511*I_L$, and a range of 512 values for the cumulative current Icum is achieved.

Based on the weighed current equation, the number of upper, lower and unit current cells to generate a cumulative current Icum is as follows:

$n_1$=Number of upper current cells=integer truncation of $((2^b-1)/I_{o,mn})$;

$n_2$=Number of lower current cells=integer truncation of $((2^b-1)-n_1*I_{o,mn})/I_{UN}$; and $n_3$=Number of unit current cells=$(2^b-1)-n_1*I_{o,mn}-n_2*I_{UN}$. Accordingly, for a 9-bit D/A converter, the total number of upper current cells is 63, the total number of unit current cells is 3 and the total number of lower current cells is 1 when the data bits b equals 9. However, the present invention may be modified when to accomodate only two different type of current cells.

The novel feature of the weighed current can be readily applied to all b-bit D/A converters. For example, if the data bus is 8-bits for an 8-bit D/A converter, the cumulative current Icum must have a total of 256 or($2^8$) different values. Using the above weighed current equation for the cumulative current Icum, A=0–31, B=0–3 and C=0–1. The cumulative current Icum can vary from zero to $255*I_L$ and a range of 256 values for the cumulative current Icum is achieved. Hence, an 8-bit D/A converter can be readily achieved with a total of 31 upper current cells, 3 unit current cells and 1lower current cell.

Further, the weighed current ratio of 8:2:1 is preferable for the upper current cells, lower current cells and unit current cells. However, as can be appreciated, the weighed current ratio can be readily modified to other appropriate weighed current ratio to achieve a desired result, and the number of upper, lower and unit current cells can be readily changed based on such appropriate weighed current ratio, and modifying the weighed current equation.

The D/A converter of the present invention also utilizes a novel group activation of the upper current cells $C_{m,n}$. Depending on the digital value on the 9-bit data bus, the upper current cells from the upper current cell $C_{1,1}$ (located at substantially at the center of the first array 10) to the upper current cell $C_{1,8}$, the upper current cells $C_{2,1}$ to $C_{2,8}$ the current cells $C_{3,1}$ to $C_{3,8}$, and so forth, are activated concurrently. In other words, the upper current cells are group activated from substantially the center of the array with concurrent bi-directional row activation and bi-directional column activation.

For example, a digital value of "010010011" on the 9-bit data bus equals a decimal value of "147". Based on the weighed current equation, the cumulative current Icum=18*$(8*I_L)+1*(2*I_L)+1*(1*I_L)=147I_L$. Hence, 18 upper current cells, 1 unit current cell and 1 lower current cell are activated to correspond to the digital value. Based on the signals on the lines $X_{k,m}$ and $Y_n$, the upper current cells $C_{1,1}$–$C_{1,8}$, $C_{2,1}$–$C_{2,8}$, $C_{3,1}$ and $C_{3,2}$ are activated, each upper current cell outputting an upper current $I_{o,mn}=8*I_L$ on the corresponding output line $O_n$. The lower current cell $C_{L1}$ and the unit current cell $C_{U1}$ are activated to output, respectively, a lower current $I_L$ and a unit current $I_{U1}=2*I_L$ on the output lines $O_L$ and $O_{U1}$.

Figure 3A:
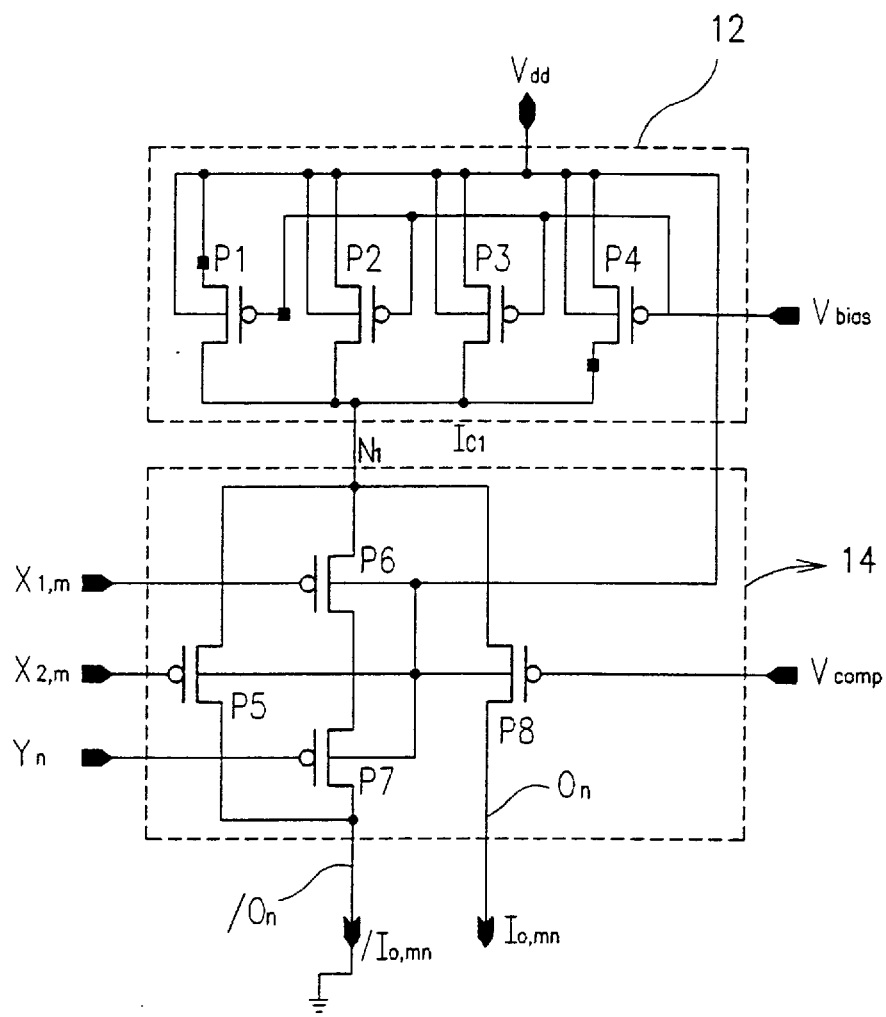
FIG. 3A is a circuit schematic of an upper current cell in a first array of FIG. 2.

FIG. 3A is a circuit schematic of an upper current cell $C_{m,n}$ in the first array 10 of the D/A converter in accordance with the present invention. The upper current cell includes a current source 12 providing a first constant current $I_{c1}$ and a switching circuit 14 providing upper currents $I_{o,mn}$ or $/I_{o,mn}$ onto the output lines $O_n$ or $O_{/n}$, respectively, where $I_{o,mn}$ and $/I_{o,mn}$ being 180° out of phase from each other. The current source 12 includes a plurality of first transistors P1–P4 connected in parallel, and the switching circuit 14 includes a plurality of second transistors P5–P8. Preferably, the plurality of first and second transistors P1–P4 and P5–P8 are PMOS transistors, but as can be appreciated, the conductivity type of the transistors can be readily modified.

Based on a comparison between the signals present on the lines $X_{1,m}$, $X_{2,m}$, and $Y_n$ and the comparison voltage $V_{comp}$, the constant current $I_{c1}$ passes through the transistor P5 or P8 such that the upper current $I_{o,mn}=I_{c1}$ or $/I_{o,mn}=I_{c1}$. As described above, each upper current $I_{o,mn}$ generated from an activated upper current cell $C_{m,n}$ onto the corresponding output line $O_n$ is summed to generated the cumulative current Icum. The output line $O_{/n}$ is preferably connected to ground.

As shown in FIG. 3A, the transistors P1–P4 of the current source 12 are connected to a substrate bias of a source potential Vdd. The sources of the transistors P1–P4 are also connected to the source potential Vdd, while the drains of the transistors P1–P4 are connected to a node N1. The gates of transistors P1–P4 are coupled for receiving the bias voltage $V_{bias}$ from the bias circuit 90.

In the switching circuit 14, the transistors P5–P8 are connected to a substrate bias of a source potential Vdd. The sources of the transistors P5–P8 are connected to the node N1. The transistors P6 and P7 are connected in series, and are connected in parallel with the transistor P5 such that the drains are coupled to the output line $O_{/n}$. The gates of transistors P5, P6 and P7 are coupled to receive the signals from input lines $X_{2,m}$, $X_{1,m}$ and $Y_n$, respectively. The drain of the transistor P8 is coupled to the output line $O_n$, and the gate is coupled for receiving the comparison voltage $V_{comp}$.

The operation of the current cell $C_{m,n}$ based on the signals outputted from the latch circuits 20 and 40 onto the input lines $Y_n$, $X_{1,m}$ and $X_{2,m}$ is illustrated in the following Table I.

TABLE I

| $Y_n$ | $X_{1,m}$ | $X_{2,m}$ | $C_{m,n}$ |
|---|---|---|---|
| 0 | 0 | 0 | OFF |
| 0 | 0 | 1 | OFF |
| 0 | 1 | 0 | OFF |
| 0 | 1 | 1 | ON |
| 1 | 0 | 0 | OFF |
| 1 | 0 | 1 | ON |
| 1 | 1 | 0 | OFF |
| 1 | 1 | 1 | ON |

When a current cell $C_{m,n}$ is indicated as ON in Table I, the reference current $I_{c1}$ flows through the transistor P8 onto the output line $O_n$ as the upper current $I_{o,mn}$. If the current cell $C_{m,n}$ is indicated as OFF, the constant current $I_{c1}$ flows through the transistor P5 or the transistors P6 and P7 onto the output line $O_{/n}$ as the upper current/$I_{o,mn}$.

Figure 3B:
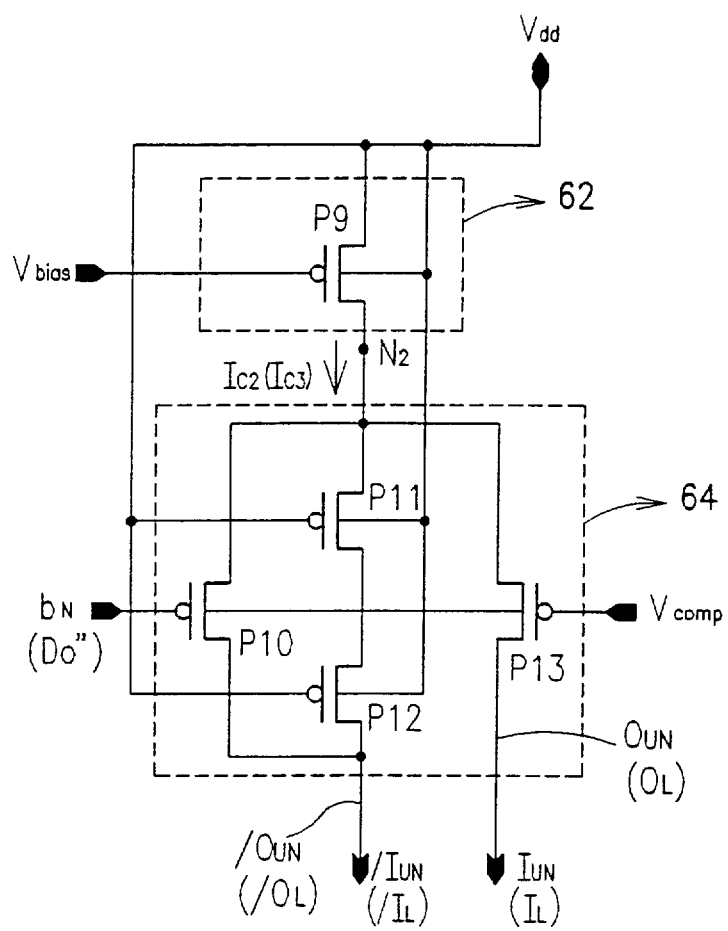
FIG. 3B illustrates a circuit schematic of a unit current cell or a lower current cell in a second array of FIG. 2.

FIG. 3B illustrates a circuit schematic of a unit current cell $C_{UN}$ or a lower current cell $C_{L1}$ in the second array 60. Each of the unit current cells $C_{UN}$ (or lower current cell $C_L$) comprises a current source 62 providing a second constant current $I_{c2}$ (or a third constant current $I_{c3}$) at a node N2, and a switching circuit 64 providing a unit current current $I_{UN}$ and /$I_{UN}$ (lower current $I_L$ or /$I_L$) onto the output lines $O_{UN}$ and $O_{/UN}$ (output lines $O_L$ and $O_{/L}$), respectively. The current source 62 comprises a transistor P9, and the switching circuit 64 includes a plurality of third transistors P10–P13. Preferably, the transistors P9–P13 are PMOS transistors, but as can be appreciated, the conductivity type of the transistors can be readily modified.

Based on the comparison of the signal on the input line $b_N$ ($D_0$") and the comparison voltage $V_{comp}$, the constant current $I_{c2}(I_{c3})$ passes through the transistors P10 or P13 such that the unit current $I_{UN}=I_{c2}$ or /$I_{UN}=I_{c2}(I_L=I_{c3}$ or /$I_L=I_{c3})$. As described above, each unit current $I_{UN}$ generated from an activated unit current cell $C_{UN}$ and the lower current $I_L$ are provided onto the corresponding output line $O_{UN}$ and output line $O_L$ for summation with the upper current $I_{o,mn}$ to generate the cumulative current Icum. The output line $O_{/UN}$ or $O_{/L}$ is preferably connected to ground.

The transistors P9–P13 are connected to the substrate bias of Vdd. The transistor P9 of the current source 62 includes a source connected for receiving the source potential Vdd, a drain connected to the second node N2 and a gate connected for receiving the bias voltage $V_{bias}$ from the bias circuit 90. In the switching circuit 64, the transistors P11 and P12 are connected in series with the drain of the transistor P11 connected to the source of the transistor P12, and the gates are connected for receiving the source potential Vdd. The serially connected transistors P11 and P12 are connected in parallel with the transistor P10, and the drains of the transistors P10 and P12 are connected to the output line $O_{/UN}$ ($O_{/L}$) As per the transistor P13, the source is connected to the node N2 and the gate is connected to receive the comparison voltage $V_{comp}$. The drain electrode of the transistor P13 is connected to the output line $O_{UN}(O_L)$.

The operation of unit current cells $C_{U1}$–$C_{U3}$ and lower current cell $C_L$ is illustrated in Table II with reference to the input data D2–D0:

TABLE II

| INPUT DATA | | | UNIT AND LOWER CURRENT CELLS | | | |
|---|---|---|---|---|---|---|
| D2 | D1 | D0 | $C_{U3}$ | $C_{U2}$ | $C_{U1}$ | $C_L$ |
| 0 | 0 | 0 | OFF | OFF | OFF | OFF |
| 0 | 0 | 1 | OFF | OFF | OFF | ON |
| 0 | 1 | 0 | OFF | OFF | ON | OFF |
| 0 | 1 | 1 | OFF | OFF | ON | ON |
| 1 | 0 | 0 | OFF | ON | ON | OFF |
| 1 | 0 | 1 | OFF | ON | ON | ON |
| 1 | 1 | 0 | ON | ON | ON | OFF |
| 1 | 1 | 1 | ON | ON | ON | ON | when a unit current cell $C_{UN}$ or a lower current cell CL is indicated as ON in Table II, the reference current $I_{c2}$ or $I_{c3}$ flows through the transistor P13 onto the output line $O_{UN}$ or $O_L$ as the unit current $I_{UN}$ or lower current $I_L$. If the unit current cell $C_{UN}$ or the lower current cell $C_L$ is indicated as OFF, the constant current $I_{c2}$ or $I_{c3}$ flows through the transistor P10 onto the output line $O_{/UN}$ or $O_{/L}$ as the unit current /$I_{UN}$ or lower current /$I_L$.

Figure 4A:
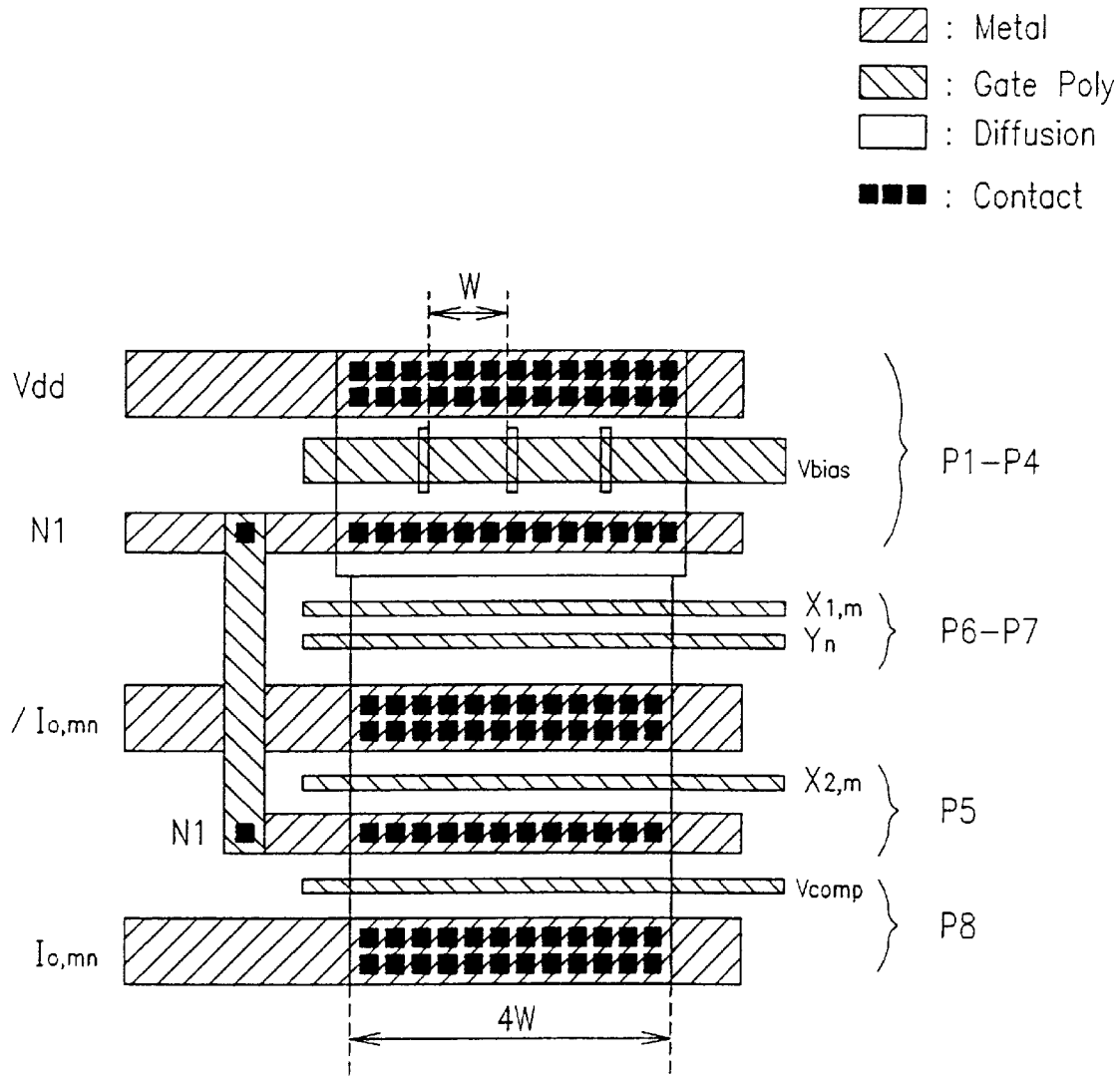
FIG. 4A illustrates a layout of the upper current cell.
Figure 4B:
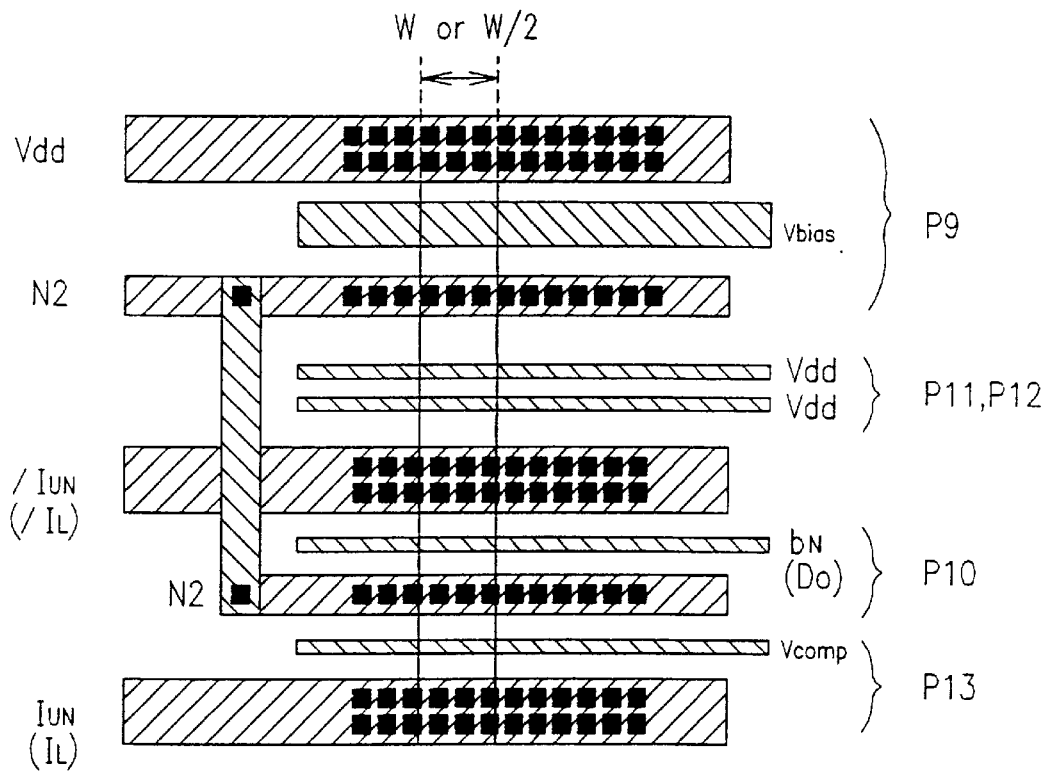
FIG. 4B illustrates a layout of the unit current cell or the lower current cell.

The layout of the upper current cell $C_{m,n}$ and the unit current cell $C_{UN}$ or the lower current cell $C_L$ are illustrated in FIGS. 4A and 4B, respectively. As shown in FIG. 4A, the source electrode of the transistors P1–P4 are in contact with a metal layer coupled to the source potential Vdd. All the transistors P1–P4 have the same size such the channel width "W" is the same, which improves the matching between the cells in the first array 10 and the second array 20. Accordingly, the cumulative channel width of the transistors P1–P4 is 4W. A polysilicon layer serves as the gate of the transistors P1–P4 and is coupled to the bias voltage $V_{bias}$. The drain electrodes of the transistors P1–P4 are in contact with the metal layer serving as the node N1.

The transistors P6 and P7 are connected in series and the gate polysilicon receives the signals on the lines $X_{1,m}$ and $Y_n$ whereas the gate polysilicon receives the signal on the line $X_{2,m}$ for the transistor P5. The transistor P5 has a drain in contact with the metal layer for outputting the upper current $I_{o,mn}$ and a source in contact with the metal layer serving as the node N1. The polysilicon layer connecting the two metal layers of node N1 serves as a parasitic low pass filter, which filters the digital noise from the input signals. The comparison voltage $V_{comp}$ is applied to the gate polysilicon of the transistor P8 having a source electrode connected to the metal layer serving as the node N1 and a drain electrode connected to the metal layer for outputting the upper current $I_{o,mn}$. The channel width of each transistor P5–P8 is equal to the sum of the channel width W of all the transistors P1–P4. Hence, the channel width of each transistor P5–P8 equals 4 W.

As shown in FIG. 4B, the source electrode of the transistor P9 is in contact with the metal layer coupled to the source potential Vdd. For a unit current cell $C_{UN}$, the transistor P9 has a channel width of W. A polysilicon layer serves as the gate electrode of the transistor P9 and is coupled to the bias voltage $V_{bias}$. The drain electrode of the transistor P9 is in contact with the metal layer serving as the node N2.

The transistors P11 and P12 are connected in series and the gate polysilicon is coupled for receiving the source potential Vdd. The gate polysilicon of the transistor P10 receives the signal on the line $b_N$(N=1–3), and the transistor P10 has a drain electrode in contact with the metal layer for outputting the unit current $I_{UN}$ and a source in contact with the metal layer serving as the node N2. Again, the polysilicon layer connecting the two metal layers of the node N2 serves as a parasitic low pass filter, which filters the digital noise from the input signals. The comparison voltage $V_{comp}$ is applied to the gate polysilicon of the transistor P13 having a source electrode connected to the metal layer serving as the node N2 and a drain electrode connected to the metal layer for outputting the current $I_{UN}$ of a unit current cell $C_{UN}$. The channel width of each transistor P10–P13 is equal to the channel width W of the transistor P9.

As discussed above, the circuit schematic of a lower current cell $C_L$ is the same as the unit current cell $C_{UN}$. Hence, the layout of the lower current cell $C_L$ is the same as shown in FIG. 4B. However, the channel width of the lower current cell is ½ W. Accordingly, if the lower current cell generates a lower current $I_L$, a unit current cell $C_{UN}$ generates a unit current which is $2*I_L$ since the width of the unit current cell transistors is two time the width of the lower current cell transistors. Further, each upper current cell $C_{m,n}$ generates an upper current of $8*I_L$ since the width of the transistors are eight times the width of the lower current cell transistors. Based on such dimensions, one of ordinary in the skill in the art may change the current weight ratio by changing the width ratio of the transistors used in the upper, unit and lower current cells.

Generally, the number of transistors in the current source of the upper cell equals $I_{o,mn}/I_{UN}$. Accordingly, the width of the switching transistors are $(I_{o,mn}/I_{UN})* W$. Further, the channel width of the transistors in the lower current cell equals $(I_L/I_{UN})*W$. Based on the weighed ratio of the currents, the channel width of the transistors to achieve alternative results.

Figure 5:
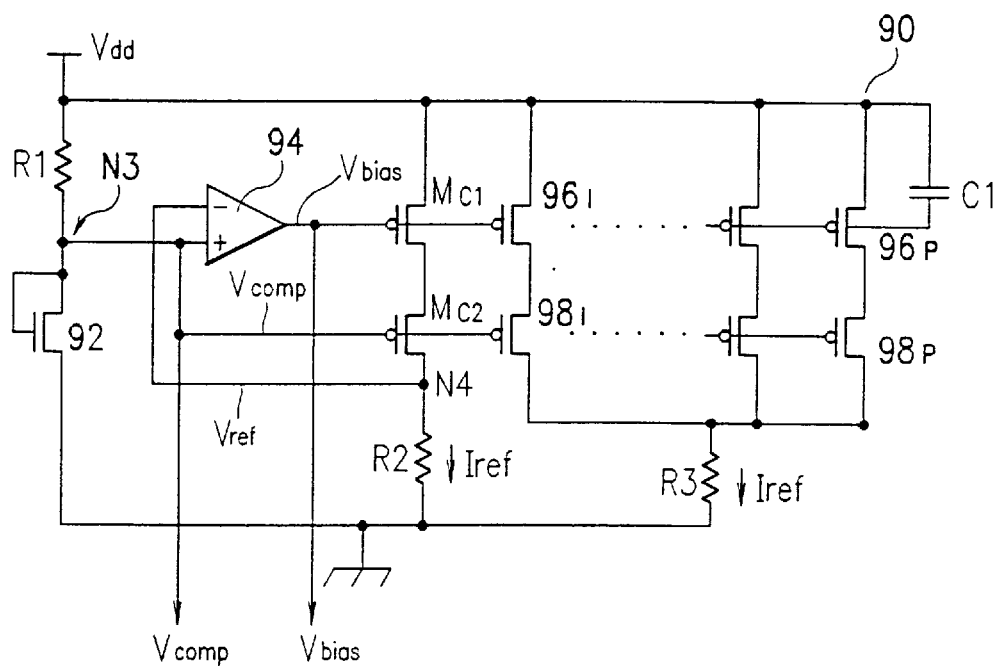
FIG. 5 is a schematic diagram of a bias circuit in accordance with the present invention.

The embodiments illustrated in FIGS. 3A and 3B have a substrate bias applied to all the transistors. Further, the gate electrodes of transistors P11 and P12 connected to a source potential. As can be appreciated, the upper, unit and lower current cells can be modified to forego the substrate biasing. Further, the gate electrodes need not be coupled to the source potential Vdd, and can be, for example, connected to the remaining lines of $b_N$. As shown, the bias circuit 90 provides the bias voltage $V_{bias}$ and comparison voltage $V_{comp}$ to each upper current cell $C_{m,n}$, each unit cell $C_{UN}$ and lower current cell $C_L$. FIG. 5 is a schematic diagram of the bias circuit 90, which includes a first resistor R1 and a transistor 92, preferably an NMOS transistor, coupled in series as a voltage divider to divide the source potential Vdd at a node N3. The transistor 92 has gate and drain electrodes connected to the node N3 and a source electrode connected to the ground potential Vgnd. The divided voltage is applied to the current cells as the comparison voltage $V_{comp}$. The negative terminal (−) of an operational amplifier 94 is connected to receive the comparison voltage $V_{comp}$ and the positive terminal (+) is connected to a second resistor R2, which is connected to a node N4.

The output of the operational amplifier 94 is connected to a first bias transistor $M_{C1}$, the gate electrodes of a plurality of first current source transistors $96_1$–$96_p$(p=1–511) and an electrode of a first capacitor C1. The source electrodes of the first bias transistor $M_{C1}$ and the first current source transistors $96_1$–$96_p$ and the other electrode of the first capacitor C1 are connected to the source potential Vdd. The comparison voltage $V_{comp}$ is also applied to the gates of a second bias transistor $M_{c2}$ and a plurality of second current source transistors $98_1$–$98_q$(q=1–511). The corresponding drain electrodes of the first bias transistor $M_{C1}$ and the first current source transistors $96_1$–$96_p$ are connected to the corresponding source electrodes of the second bias transistor $M_{C2}$ and the second current source transistors $98_1$–$98_q$. The drain electrodes the second bias transistor $M_{C2}$ and the second current source transistors $98_1$–$98_q$ are connected to the second resistor R2 and a third resistor R3, respectively, which are also connected to the ground potential Vgnd. The first and second bias transistors and the plurality of first and second current source transistors are preferably PMOS transistors.

The comparison voltage $V_{comp}$ is very stable compared to the conventional art because the comparison voltage $V_{comp}$ is determined by a threshold voltage $Vth_{92}$ of the transistor 92. The stability of the comparison voltage $V_{comp}$ is important since variations in the comparison voltage $V_{comp}$ deteriorate the operation of the D/A converter. The threshold voltage $Vth_{92}$ is very stable compared to a divided voltage determined by a resistor network, which is generally used to divide a voltage. Further, the threshold voltage $Vth_{92}$ prevents the noise generated from the source potential Vdd. Instead of the comparison voltage $V_{comp}$ being determined by the proportions of a resistor network, the comparison voltage $V_{comp}$ equals the threshold voltage $Vth_{92}$ of the transistor 92 ($V_{comp}=Vth_{92}$).

Due to the feedback characteristics of the operational amplifier 94, the reference voltage $V_{ref}$ equals $V_{comp}$, and the reference current $I_{ref}=V_{ref}/R2=V_{comp}/R2$. When the reference current $I_{ref}$ flow through the first bias transistor $M_{C1}$, the operational amplifier 94 generates the bias voltage $V_{bias}$, which is applied to the gates of the first current source transistors $96_1$–$96_p$. Since the characteristics of the D/A converter can deteriorate due to variations in the bias voltage $V_{bias}$, the capacitor C1 maintains a voltage between the bias voltage $V_{bias}$ and the source potential Vdd.

As shown in FIG. 2, the latch circuits 20, 40 and 70 provide the decoded signals from the first, second and third decoders 30, 50 and 70. The first and second thermometer decoders 30 and 50 are preferably 3-to-8 decoders which generate 8-bit decoded signals in response to the input data D8–D6 and D5–D3, respectively. However, one of the bits is not used, e.g., preferably the least significant bit for the first decoder 30 and the most significant bit for the second decoder 50, such that 7-bit decoded signals are provided on the lines $A_8$–$A_2$ and $B_7$–$B_1$. The third thermometer decoder 70 is a 2-to-4 decoder which generates four bit decoded signals in response to the input data D2–D1. Similar to the first and second thermometer decoders 30 and 50, one of the bits is not used, e.g., the most significant bit, such that 3-bit signals are provided on the lines $a_3$–$a_1$.

As can be appreciated, the decoders can be readily modified. If the input to the decoder is d-bits, a d-to$2^d$ decoder is used for the first, second and decoders. For design purposes, the same decoders can be used, and unused output bits can be ignored. Various modification and alternative embodiments of the selection circuit is readily apparent from the teachings of the present invention invention.

When the 7-bit decoded signals from the first and second thermometer decoders 30 and 50 are latched by the first and second latch circuits 20 and 40, respectively, and the 3-bit decoded signals from the third thermometer decoder 80 is latched by the third latch circuit 70. To latch the 7-bit decoded signals, each of the first and second latch circuits 20 and 40 includes seven latches, whereas the third latch 70 includes three latches to latch the 3-bit decoded signals. The first and second latches L1 and L2 latch the input data D0.

Figure 6A:
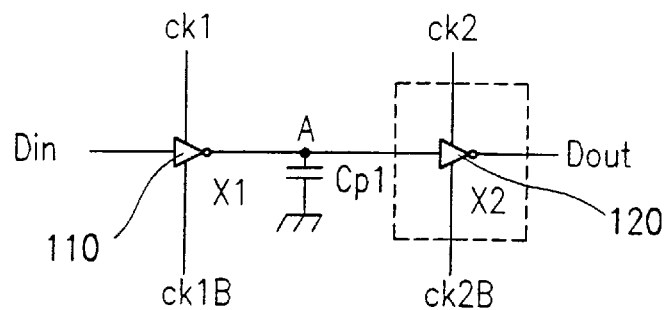
FIG. 6A is a diagram of a latch used in the latch circuits and latches of FIG. 2.

FIG. 6A is a diagram of a latch 100 used in the first, second and third latch circuits 20, 40 and 70 and latches L1 and L2. The latch 100 includes a first tri-state inverter 110 receiving a decoded signal Din and connected to a second tri-state inverter 120 to provide an latched output signal Dout. The first tri-state inverter 110 receives the clock signals CK1 and /CK1 generated by the clock generator, and the second tri-state inverter 120 receives the clock signals CK2 and /CK2 generated by the clock generator. A capacitance Cp1 exists between the connection of the first and second tri-state inverters 110 and 120.

Figure 6B:
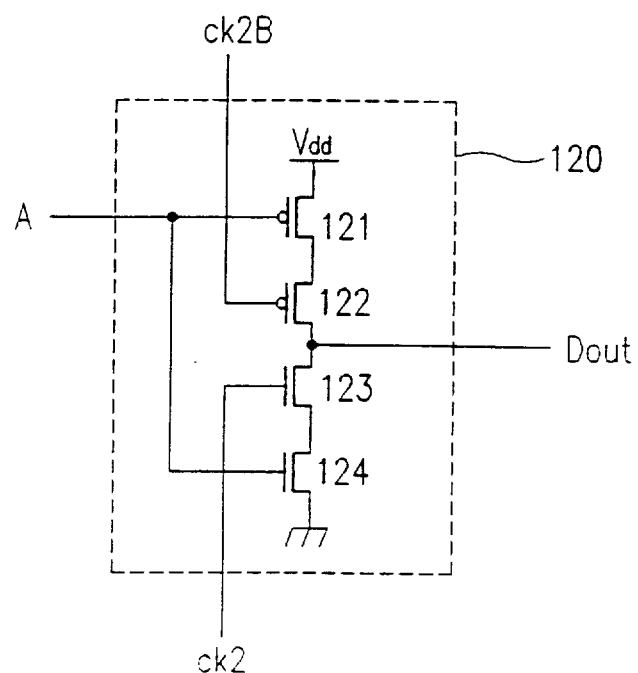
FIG. 6B is a detailed circuit schematic of a tri-state inverter used in the latch.

FIG. 6B is a detailed circuit schematic of the tri-state inverter 120, which includes two pairs of serially connected transistors. The first pair of transistor includes first transistors 121 and 122, and the second pair of transistors includes second transistors 123 and 124. The gates of the transistors 121 and 124 are coupled to receive the signal from the node A. The gate of the transistor 122 is coupled to receive the clock signal /CK2 and the gate of the transistor 123 is coupled to receive the clock signal CK2. The source of the transistor 121 is connected to the source potential Vdd and the source of the transistor 124 is connected to the ground potential Vgnd. The latched signal Dout is provided at the connection between the first and second pairs of transistors 121–122 and 123–124. Preferably, the first pair comprises PMOS transistor, and the second pair comprises NMOS transistors.

Figure 6C:
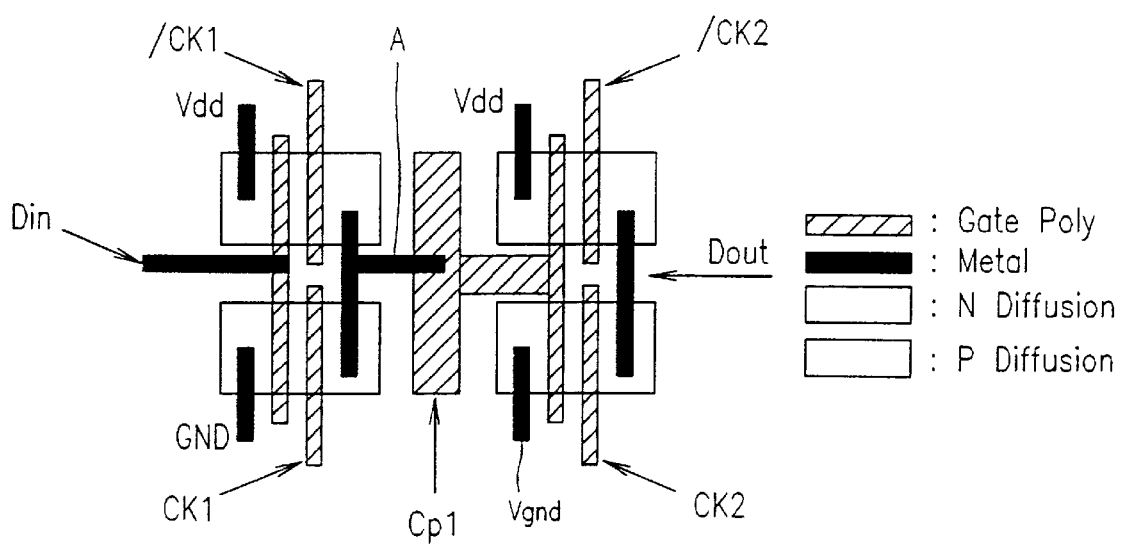
FIG. 6C illustrates the layout of the latch.

FIG. 6C illustrates the layout of the latch 100. As shown, the polysilicon wiring layer connecting the first and second tri-state inverters 110 and 120 is made sufficiently large to intentionally provide an appropriate capacitance such that the output of the first tri-state inverter is stored in the capacitance Cp1 for a predetermined period of time. The area of the polysilicon wiring layer is appropriate chosen to properly store the decoded signal Din for a predetermined period of time. Hence, the capacitance value of the capacitance Cp1 is selected based on a balance of the need to prevent leakage current, which deteriorates the stored signal, and the need to optimize the speed of the D/A converter. Preferably, the capacitance value is about 3 fF~100 fF (femto Farads, i.e., $1\times10^{-15}$ Farads). The clock cycles are chosen to prevent the overlap of clock signals CK1 and CK2, which prevents glitches during the operation.

Figure 6D:
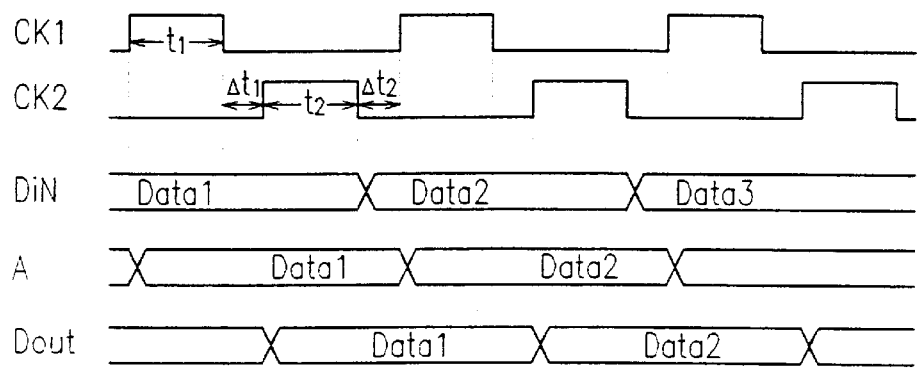
FIG. 6D is an operational timing diagram of the latch.

FIG. 6D is a operational timing diagram of the latch 100. If the clock signal CK1 is high for time period of $t_1$, the first inverter 110 is turned ON and an inverted decoded signal is stored in the parasitic capacitance Cp1. Since the clock signal CK2 is low, the second inverter 120 is OFF and isolated from inverted decoded signal Din. To prevent an overlap of clock signals CK1 and CK2, a timing difference of $\Delta t_1$ between the transition of the clock signal CK1 from high to low and the transition of the clock signal CK2 from low to high. Due to the capacitance Cp1, the inverted decoded signal is properly stored during the timeing difference $\Delta t_1$.

When the clock signal CK2 transits to a high state, the second inverter 120 is ON and the first inverter is OFF. The inverted decoded signal Din stored in the capacitance Cp1 is inverted and outputted by the second inverter 120 as the output signal Dout. When the clock signals CK1 and CK2 transit from high to low and the inverters, the outputs of first and second tri-state inverters or buffers maintain the previous output states until the transition of low to high by the clock signals CK1 and CK2. Such an operation is repeated through the clock cycles of clock signals CK1 and CK2. As shown, a timing difference of $\Delta t_2$ between the transition of the clock signal CK2 from high to low and the transition of the clock signal CK1 from low to high. As can be appreciated, the timing differences $\Delta t_1$ and $\Delta t_2$ may or may not be the same.

The operation of the D/A converter of the present invention can be understood with reference to the above example when a digital value of "010010011" is applied as the 9-bit digital data D8–D0 on the data bus. As indicated above, 18 upper current cells ($C_{1,1}$–$C_{1,8}$, $C_{2,1}$–$C_{2,8}$, $C_{3,1}$ and $C_{3,2}$), 1 unit current cell $C_{U1}$ and 1 lower current cell $C_L$ need to be activated to correspond to the digital value.

When the 3-bit digital data D8–D6 of "010" are applied to the first thermometer decoder 30, decoded signals of "0000011" are generated on the lines $A_8$–$A_2$, which are inputted to corresponding latches in the first latch circuit 20. The latches precisely synchronizes each decoded signal and supply those signals to the input lines Y1,m and Y2,m−1 for 1<m≦8. Similarly, the second thermometer decoder 50 decodes the 3-bit digital data D5–D3 of "010" to provide decoded signals "0000011" onto the lines $B_7$–$B_1$. The decoded signals are inputted into the corresponding latches in the second latch circuit 40, which provides the latched signal onto the input lines $Y_7$–$Y_1$. Based on the signals on the input lines $X_{k,m}$ and $Y_n$, the upper current cells $C_{1,1}$–$C_{1,8}$, $C_{2,1}$–$C_{2,8}$, $C_{3,1}$ and $C_{3,2}$ are activated to provide the upper currents for summation.

The third thermometer decoder decodes the 2-bit digital data D2–D1 of "01" to provide output signal of "001" on the lines $a_3$–$a_1$, which is latched into the third latch 70. After latching, the latched signals of "001" is provided on the lines $b_3$–$b_1$. In response to such latched signals activate the unit current cell $C_{U1}$ while the rest of the current cells remains OFF. The least significant bit D0 of "1" is provided into the first and second latches L1 and L2 onto the line $D_0$" to activate the lower current cell $C_L$. Hence, the unit current cell $C_{U1}$ and the lower current cell $C_L$ output the unit current $I_{U1}$ and the lower current $I_L$ onto the output lines $O_{U1}$ and $O_L$. The upper current $I_{o,mn}$, the unit current $I_{U1}$ and the lower current $I_L$ are summed to provide the cumulative current Icum corresponding to the digital value on the data bus.

For example, if the source potential Vdd=5.0 V, a sufficient bias voltage should be applied to saturate the transistors P1–P4. If the bias circuit 90 generates a bias voltage $V_{bias}$=3.0 V and a comparison voltage Vcomp of 2.0 V, the upper, unit and lower cell currents equal approximately 408

μA, 102 μA and 51 μA, respectively. In the above example, Icum=(18*408 μA)+(1*102 μA)+(1*51 μA)=7,497 μA.

Figure 7:
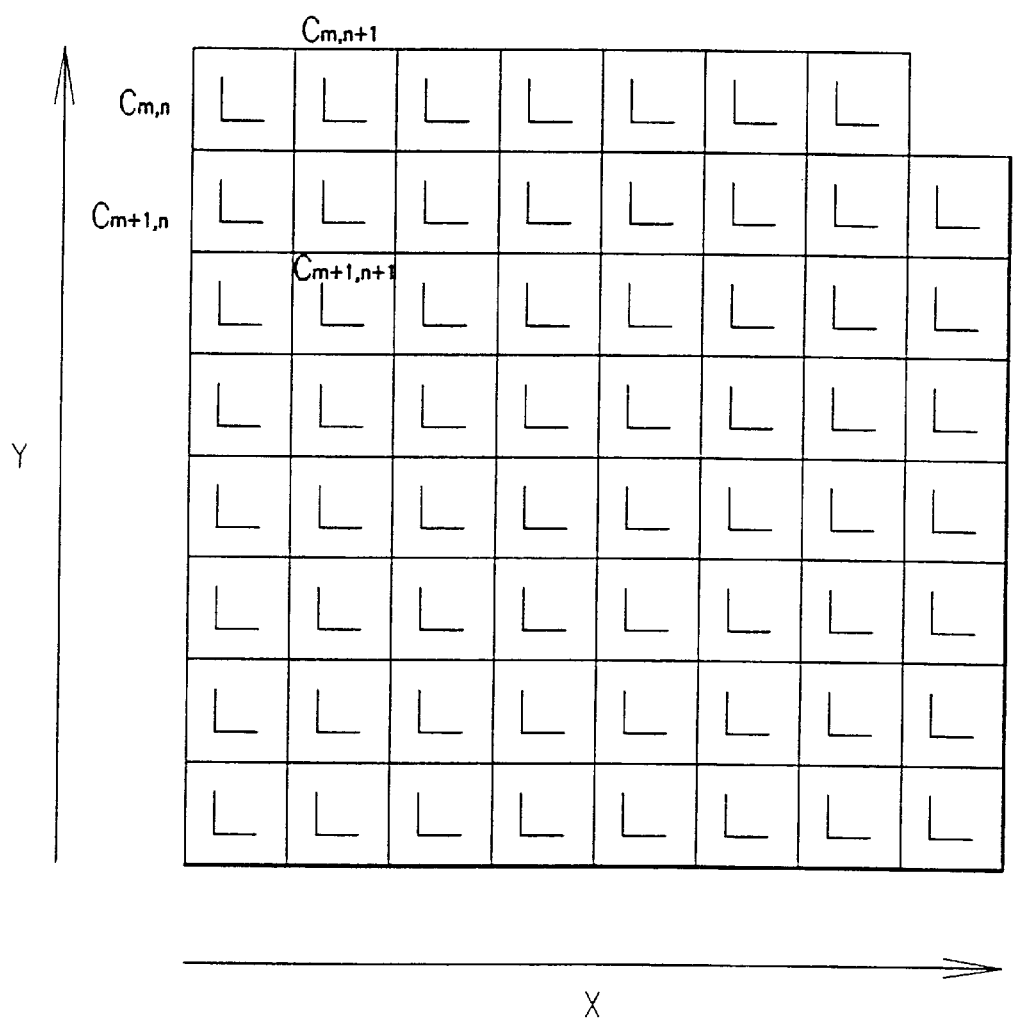
FIG. 7 illustrates the layout of each upper current cell in the first array, in accordance with an embodiment of the present invention.

FIG. 7 illustrates the layout of each upper current cell $C_{m,n}$ in the first array 10. In this embodiment, the upper current cell layout illustrated in FIG. 4A can be used such that the upper current cells adjacent to each other in the x and y direction have the same orientation.

Figure 8A:
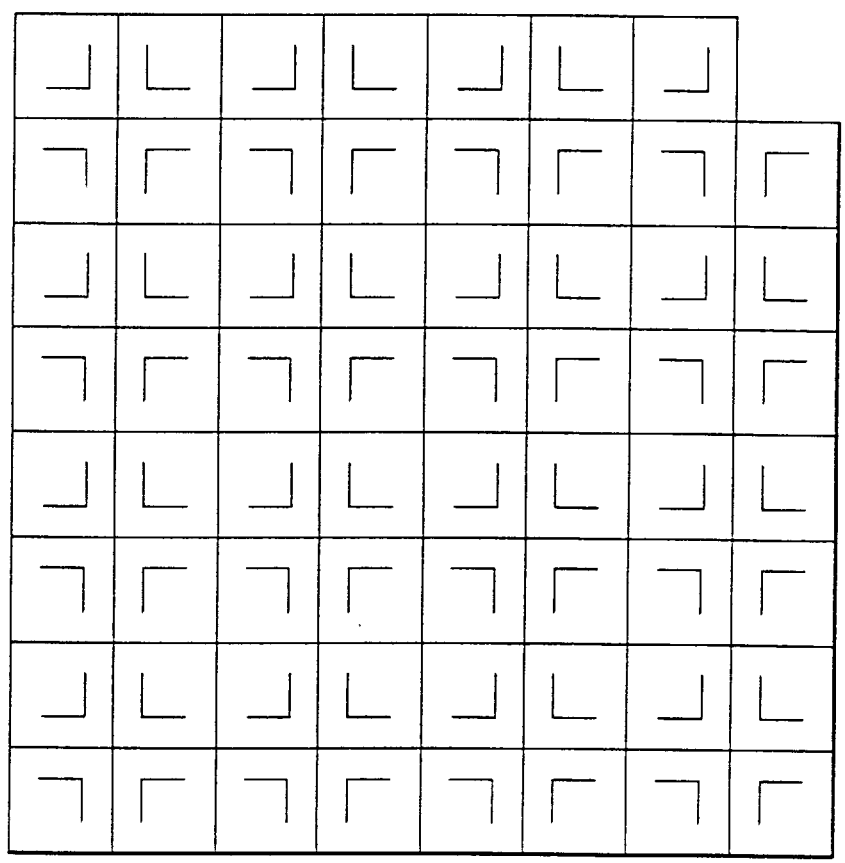
FIG. 8A illustrates the layout of each upper current cell in the first array, in accordance with another embodiment of the present invention.

FIG. 8A illustrates the layout of each upper current cell $C_{m,n}$ in the first array 10 and FIG. 8B illustrates the layout of four adjacent upper current cells in accordance with an alternative embodiment of the present invention. As shown, upper current cells adjacent to each other in the x and y direction has a reverse orientation. This reverse orientation is disclosed in U.S. Ser. No. 08/336,686 of the same inventor and commonly assigned to the same assignee of this application. Such reverse orientation improves the differential and integral non-linearities and decreases crosstalk caused by undesirable digital noise. As can be appreciate, not all the upper current cells may have the reverse orientation. For example, a group of upper current cells in the first array 10 may have the reverse orientation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A circuit for converting a digital signal of b-bits to an analog signal, where b is a positive integer, comprising:

a first array of first current cells;

a second array having at least one second current cell;

a selection circuit coupled to said first and second arrays such that a first predetermined number of first current cells and a second predetermined number of second current cells are activated in accordance with the digital signal; and means for generating at least one of voltages and clock signals coupled to at least one of said first and second arrays and said selection circuit, wherein each selected first current cell generates a predetermined first current and each selected second current cell generates a predetermined second current to an output line, said predetermined first current having a magnitude different from said predetermined second current and wherein the magnitude of said first and second predetermined currents has a prescribed ratio of $I_1:I_2$;

wherein said second array includes at least one third current cell which is coupled to said selection circuit such that a selected third current cell outputs a third predetermined current having a magnitude which is different from the second predetermined current; and wherein the magnitude of said first, second, and third predetermined currents has a prescribed ratio of $I_1:I_2:I_3$.

2. The circuit of claim 1, wherein the magnitude of the predetermined first current is greater than the predetermined second current.

3. The circuit of claim 1, wherein the prescribed ratio $I_1:I_2:I_3$ is 8:2:1.

4. The circuit of claim 1, wherein a number $n_1$ of first current cells in said first array is equal to an integer truncation of $(2^b-1)/I_1$.

5. The circuit of claim 4, wherein a number $n_2$ of at least one second current cell in said second array is equal to an integer truncation of $\{(2^b-1)-n_1*I_1\}/I_2\}$.

6. The circuit of claim 5, wherein a number $n_3$ of at least one third current cell in said second array is equal to $(2^b-1)-n_1*I_1-n_2*I_2$.

7. The circuit of claim 1, wherein said each current cell in said first, second and third current cells comprises:

a current source coupled between a first potential and a node; and a switching circuit coupled to the node and including:
   a) serially connected transistors coupled between the node and a second potential;
   b) a first transistor coupled in parallel with said serially connected transistors; and
   c) a second transistor coupled between the node and an output line of the converter.

8. The circuit of claim 7, wherein said current source of said first current cell comprises $(I_1/I_2)$ number of transistors coupled in parallel, each transistor of said first and second current cells having a predetermined channel width W.

9. The circuit of claim 8, wherein said first and second transistors of said first current cell has a channel width of $(I_1/I_2)*W$.

10. The circuit of claim 8, wherein said current source of said second current cell comprises $I_3$ number of transistors coupled in parallel.

11. The circuit of claim 8, wherein said current source of said third current cell comprises a third transistor having a predetermined channel width of $(I_3/I_2)*W$.

12. The circuit of claim 1, wherein said second array includes at least one third current cell which is coupled to said selection circuit such that a selected third current cell outputs a third predetermined current having a magnitude which is less than the second predetermined current.

13. The circuit of claim 1, wherein the prescribed ratio $I_1:I_2$ is 4:1.

14. The circuit of claim 1, wherein a number $n_1$ of first current cells is equal to an integer truncation of $(2^b-1)/I_1$.

15. The circuit of claim 14, wherein a number $n_2$ of at least one second current cell is $(2^b-1)-n_1*I_1$.

16. The circuit of claim 1, wherein said first current cells are selected by said selection circuit from a current cell located at substantially a central location of said first array with concurrent bi-directional activation of selected first current cells.

17. The circuit of claim 16, wherein the concurrent bi-directional activation is in both column and row directions of the first array.

18. The circuit of claim 1, wherein each of said first current cells have a prescribed layout, and said first array has a group of current cells where each cell has a reverse orientation of an adjacent current cell in the group.

19. The circuit of claim 18, wherein the adjacent current cells of the group have reverse orientation of the prescribed layout in both column and row directions.

20. The circuit of claim 1, wherein each current cell in said first and second current cells comprises:

a current source coupled between a first potential and a node; and a switching circuit coupled to the node and including:
   a) serially connected transistors coupled between the node and a second potential;
   b) a first transistor coupled in parallel with said serially connected transistors; and
   c) a second transistor coupled between the node and an output line of the converter.

21. The circuit of claim 20, wherein said current source of comprises a predetermined number m of transistors coupled in parallel, each transistor of said current source having a predetermined channel width W.

22. The circuit of claim 21, wherein said first and second transistors of said current cell has a channel width of m*W.

23. The circuit of claim 1, wherein said means includes a bias circuit having
- a first resistor coupled between a first potential and a first node;
- a first transistor coupled between the first node and a second potential;
- a pair of first and second bias transistors coupled between the first and second potential;
- a current source coupled to said first and second bias transistors and coupled between the first and second potentials; and
- an operational amplifier having a first input coupled to the first node and said second bias transistor, a second input coupled to the second bias transistor and said current source, and an output coupled to said first bias transistor and said current source.

24. The circuit of claim 23, further comprising a capacitor coupled to said current source and said first potential.

25. The circuit of claim 23, wherein said current source comprises a first current source and a second current source coupled to each other, said first current source being coupled to said first bias transistor and the first potential and said second current source being coupled to said second bias transistor, said first current source and the second potential.

26. The circuit of claim 25, wherein said first current source comprising $(2^b-1)$ number of first current source transistor and said second current source comprising $(2^b-1)$ number of second current source transistors.

27. The circuit of claim 25, further comprising a third resistor coupled between said second current source and the second potential.

28. The circuit of claim 23, further comprising a second resistor coupled between said second bias transistor and the predetermined potential.

29. The circuit of claim 1, wherein said selection circuit comprises:
- first and second latch circuits coupled to said first and second array respectively;
- first and second decoders coupled to said first and second latch circuits and coupled for receiving the digital signal.

30. The circuit of claim 29, wherein each of said first and second latch circuits includes a plurality of latches having first and second inverters responsive to the clock signals, said first and second inverter being coupled by a wiring having a capacitance to store an output of said first inverter for a predetermined period of time.

31. The circuit of claim 1, wherein each of said first current cells have a prescribed layout, and said first array has a group of current cells where each cell of the group has a different orientation of an adjacent current cell in the group.

32. A cell array for a b-bit digital to analog converter, comprising:
- a plurality of first current cells; and
- at least one second current cell, wherein
- each of said first current cell generates a predetermined first current and each second current cell generates a predetermined second current, said predetermined first current having a magnitude different from said second predetermined current, and wherein the magnitude of said first and second predetermined currents has a prescribed ratio of $I_1:I_2$;
- at least one third current cell which generates a third predetermined current; wherein magnitudes of said first, second, and third currents are different;

the magnitude of said first, second, and third predetermined currents has a prescribed ratio of $I_1:I_2:I_3$.

33. The cell array of claim 32, wherein the prescribed ratio $I_1:I_2:I_3$ is 8:2:1.

34. The cell array of claim 32, wherein a number $n_1$ of first current cells is equal to an integer truncation of $((2^b-1)/I_1)$.

35. The cell array of claim 32, wherein a number $n_2$ of at least one second current cell is equal to an integer truncation of $\{(2^b-1)-n_1*I_1)/I_2\}$.

36. The cell array of claim 32, wherein a number $n_3$ of at least one third current cell in said second array is equal to $(2^b-1)-n_1*I_1-n_2*I_2$.

37. The cell array of claim 32, wherein each current cell has a prescribed layout and said plurality of first cells include a group of cells where each cell has a reverse layout orientation of an adjacent cell in the group.

38. The cell array of claim 32, wherein each of said first current cells have a prescribed layout, and said first array has a group of current cells where each cell of the group has a different orientation of an adjacent current cell in the group.

39. A current cell for a digital to analog converter, comprising:
- a current source coupled between a first potential and a node; and
- a switching circuit coupled to the node and including:
  a) serially connected transistors coupled between the node and a second potential;
  b) a first transistor coupled in parallel with said serially connected transistors and coupled to the second potential; and
  c) a second transistor coupled to the node and an output line of the converter.

40. The current cell of claim 39, wherein said current source comprises a predetermined number (n) of transistors coupled to each other, each transistor having a predetermined channel width W.

41. The current cell of claim 40, wherein said first and second transistors of said first current cell has a channel width of n*W.

42. The current cell of claim 39, wherein the first and second potentials are source and ground potentials, respectively, and said first and second transistors are PMOS transistors.

43. The current cell of claim 39, wherein control electrodes of said serially connected transistors are coupled together to receive the first potential.

44. The current cell of claim 39, wherein control electrodes of said second and third transistors are coupled to receive third and fourth potentials, respectively.

45. A bias circuit for a digital to analog converter, comprising:
- a first resistor coupled between a first potential and a first node;
- a first transistor coupled to the first node and a second potential;
- a pair of first and second bias transistors coupled between the first and second potential;
- a current source coupled to said first and second bias transistors and coupled between the first and second potentials;
- an operational amplifier having a first input coupled to the first node and said second bias transistor, a second input coupled to the second bias transistor and said current source, and an output coupled to said first bias transistor and said current source; and a capacitor coupled to said current source, and said first potential.

46. The bias circuit of claim 45, wherein said current source comprises a first current source and a second current source coupled to each other, said first current source being coupled to said first bias transistor and the first potential and said second current source being coupled to said second bias transistor, said first current source and the second potential.

47. The bias circuit of claim 46, wherein said first current source comprising ($2^b$-1) number of first current source transistors and said second current source comprising ($2^b$-1) number of second current source transistors.

48. The bias circuit of claim 47, wherein said transistors of said first and second current source are PMOS transistors.

49. The bias circuit of claim 45, further comprising a second resistor coupled between said second bias transistor and the predetermined potential.

50. The bias circuit of claim 49, further comprising a third resistor coupled between said current source and the second potential.

51. The bias circuit of claim 45, wherein the first and second potentials are source and ground potentials, respectively.

52. The bias circuit of claim 45, wherein said first transistor is an NMOS transistor, and said first and second bias transistors are PMOS transistors.

53. A circuit for converting a digital signal of b-bits to an analog signal, where b is a positive integer, comprising:

a first array of first current cells; and a selection circuit coupled to said first array such that a first predetermined number of first current cells is activated, wherein said first current cells are selected by said selection circuit from a current cell located at substantially a central location of said first array with concurrent bi-directional activation of selected first current cells.

54. The circuit of claim 53, wherein the concurrent bi-directional activation is in both column and row directions of the first array.

55. The circuit of claim 53 further comprising a second array having at least one second current cell and coupled to said selection circuit.

56. The circuit of claim 55 further comprising means for generating at least one of voltages and clock signals coupled to at least one of said first and second arrays and said selection circuit.

* * * * *